United States Patent [19]

Suzuki et al.

[11] Patent Number: 5,048,967
[45] Date of Patent: Sep. 17, 1991

[54] DETECTION OPTICAL SYSTEM FOR DETECTING A PATTERN ON AN OBJECT

[75] Inventors: Akiyoshi Suzuki, Tokyo; Hideki Ina, Kawasaki, both of Japan

[73] Assignee: Canon Kabushiki Kaisha, Tokyo, Japan

[21] Appl. No.: 579,252

[22] Filed: Sep. 5, 1990

Related U.S. Application Data

[63] Continuation of Ser. No. 503,127, Apr. 2, 1990, abandoned, which is a continuation of Ser. No. 214,400, Jul. 1, 1988, abandoned.

[30] Foreign Application Priority Data

Jul. 2, 1987 [JP] Japan .................................. 62-164068

[51] Int. Cl.$^5$ ............................................. G01B 11/00
[52] U.S. Cl. .................................... 356/401; 356/400; 356/237; 356/394
[58] Field of Search ................. 356/400, 401, 237, 394

[56] References Cited

U.S. PATENT DOCUMENTS

| | | |
|---|---|---|
| 4,062,623 | 12/1977 | Suzuki et al. |
| 4,199,219 | 4/1980 | Suzuki et al. |
| 4,406,546 | 9/1983 | Suzuki ............................ 356/400 |
| 4,634,876 | 1/1987 | Ayata ............................. 356/400 |
| 4,641,035 | 2/1987 | Suzuki et al. .................. 356/400 |
| 4,663,534 | 5/1987 | Ayata et al. ................... 356/401 |
| 4,669,875 | 6/1987 | Shiba et al. ................... 356/237 |
| 4,677,301 | 6/1987 | Tanimoto et al. .............. 250/548 |
| 4,717,257 | 1/1988 | Kaneta et al. ................. 356/400 |
| 4,741,621 | 5/1988 | Taft et al. ..................... 356/394 |
| 4,789,242 | 12/1988 | Takagi et al. .................. 356/372 |

OTHER PUBLICATIONS

"Journal of Electronic Materials", vol. 3, No. 1, pp. 225–242, (1974).

Primary Examiner—Léon Scott, Jr.
Attorney, Agent, or Firm—Fitzpatrick, Cella, Harper & Scinto

[57] ABSTRACT

A detection optical system for detecting a pattern on the surface of an object includes an illumination device for illuminating the surface of the object with a light beam, a scanning system cooperable with the illumination device to scan the surface of the object with the light beam, and an optical arrangement for receiving light from each point on the surface of the object scanningly illuminated with the light beam by the cooperation of the illumination device and the scanning system. The optical arrangement is effective to form an image of a light spot, formed by the light beam upon the surface of the object. The optical arrangement includes a stop member disposed at a position whereat the image of the light spot is formed. The stop member has an aperture of a size substantially the same as, or not greater than, that of the image of the light spot, wherein the pattern on the surface of the object is detected on the basis of light passed through the stop member.

19 Claims, 5 Drawing Sheets

DETECTION OPTICAL SYSTEM FOR DETECTING A PATTERN ON AN OBJECT

This application is a continuation of application Ser. No. 07/503,127 filed 4/2/90, now abandoned; which is a continuation of application Ser. No. 07/214,400 filed Jul. 1, 1988, now abandoned.

FIELD OF THE INVENTION AND RELATED ART

This invention relates to a detection optical system for detecting a pattern on the surface of an object and, more particularly, to a detection optical system suitably usable in the field of manufacture of semiconductor microcircuits, for detecting an alignment mark pattern provided on the surface of a wafer which is coated with a resist layer.

Examples of this type of detection optical systems are disclosed in U.S. Pat. Nos. 4,062,623 and 4,199,219, assigned to the same assignee of the subject application, and "Journal of Electronic Materials" Vol. 3, No. 1, pp. 225-242 (1974).

U.S. Pat. No. 4,062,623 mentioned above discloses an optical arrangement wherein an image of a light source is formed at the pupil of an objective lens and a predetermined area on the surface of an object is irradiated with light from the objective lens. A spatial filter is provided at a position which is optically conjugate with the pupil of the objective lens while a scanning means (scanner) comprising a movable slit is provided at a position which is optically conjugate with the surface of the object, such that, through the scanner and the spatial filter, only the scattered light from a pattern on the surface of the object is selectively extracted. While the disclosed optical arrangement has a possibility of high-precision pattern detection, it is difficult to obtain scattered light of high intensity because the light that irradiates each point on the surface of the object is provided by a portion of the light from the objective lens.

On the other hand, U.S. Pat. No. 4,199,219 and "Journal of Electronic Materials" mentioned above show an optical arrangement wherein a light beam from a laser is directed to an objective lens and the surface of an object is scanned with the light beam passed through the objective lens. The scattered light from a pattern on the surface of the object is extracted by use of a spatial filter. Since, in this optical arrangement, each point on the surface of the object is irradiated with the light focused on the object surface, the scattered light has a higher intensity, with a result of an increased sensitivity for the detection of the pattern.

These detection optical systems, of the type discussed above, wherein the surface of an object is scanned with a light beam, have been effectively used in the field of aligning a mask and a wafer in a semiconductor device manufacturing exposure apparatus, for detecting alignment marks formed on the mask and the wafer.

However, there are some problems to be considered, when the detection optical system is used to detect an alignment mark formed on a wafer whose surface is coated with a resist layer. One of the problems results from non-uniform application of a photoresist material which might be caused during wafer treatment processes, that is, the asymmetry of a photoresist layer covering an alignment mark on a wafer.

Referring to FIG. 1, the surface of a wafer having an alignment mark 1 is coated with a photoresist material. If, as illustrated, there is asymmetry between a left-hand photoresist layer portion 12L and a right-hand photoresist layer portion 12R with respect to the angle of inclination of the surface of the photoresist layer, which results from the presence of a protrusion (or recess) forming the alignment mark 1, there occurs similar asymmetry in an electric signal obtained by detecting light from the alignment mark 1. Accordingly, it is difficult to correctly determine the center of the alignment mark 1.

If, for example, the asymmetry of the photoresist layer, described above, is constant for different alignment marks or different wafers, such asymmetry appears, in the electric signal, in the form of averaged shift o deviation for the different alignment marks, such that it can be compensated for as an "offset". If, however, there is a difference in the asymmetry between different wafers or different shot areas on the same wafer (when different shot areas on the same wafer have respective alignment marks which should be detected sequentially or in a step-and-repeat manner), compensation is difficult to achieve, with a disadvantageous result of deteriorated detection accuracy.

Particularly, as illustrated in FIG. 2, a light beam such as at 13 impinging upon a photoresist layer is once refracted thereby and then it is reflected by the surface of the wafer 2. Accordingly, there is a high probability that different kinds of light rays emanate outwardly from the photoresist layer. Considering the action within the right-hand photoresist layer portion 12R in FIG. 1, for example, there will occur, as illustrated in FIG. 2, light 14 reflected once by the wafer 2 surface, light 15 reflected twice by the wafer 2 surface, light 16 reflected three times by the wafer 2 surface and so on. Such multireflection of light, as depicted by the lights 14, 15, 16, . . . , is notably affected by a small difference in the angle of inclination of the photoresist layer.

The action of light described above means that a light beam such as at 13 impinging upon a photoresist layer is substantially shifted laterally and is scattered, irrespective that the light beam is actually incident at the point P on the photoresist layer. This presents a problem when precise measurement is to be made in relation to the position of incidence of a light beam. Particularly, in a system wherein the position of incidence of a light beam should be determined exactly, for example, a measuring system wherein a light beam is projected upon the surface of an object and the light reflected from the object surface is detected to determine the position of a pattern formed on the object surface, there is a high probability that the reflected light emerges from a point deviated from the position of incidence P of the projected light beam and that the emerging light is detected as if it is a signal corresponding to the position P. This causes a measurement error.

Further, in a system such as shown in FIG. 3, for example, wherein light scattered by an edge 8 of a mark pattern is to be detected, there is a possibility that, before an edge detecting light beam such as at 13 scans the edge 8 position, light such as at 15, having been multireflected by a photoresist layer and the surface of a wafer 2, impinges upon the edge 8 and is scattered thereby. If this occurs, the edge 8 position may be detected as if it is at the point of incidence P of the light beam 13.

Additionally, when there is no photoresist layer on the surface of an object, but a plurality of mark patterns are formed on the surface of the object, as in the case of FIG. 4, there is a possibility that a projected light is propagated between the marks in the manner as illustrated so that a reflected light beam emanates from a different mark pattern. This causes deterioration of the measurement accuracy.

SUMMARY OF THE INVENTION

It is accordingly a primary object of the present invention to provide a detection optical system by which a pattern on the surface of an object can be detected very accurately.

In accordance with one aspect of the present invention, to achieve the above object, there is provided a detection optical system for detecting a pattern on the surface of an object, comprising:

illumination means for illuminating the surface of the object with a light beam;

scanning means cooperable with said illumination means to scan the surface of the object with the light beam; and an optical arrangement for receiving light from each point on the surface of the object as scanningly illuminated with the light beam by the cooperation of said illumination means and said scanning means, said optical arrangement being effective to form an image of a light spot, formed by the light beam upon the surface of the object, said optical arrangement including a stop member disposed at a position whereat the image of the light spot is formed, said stop member having an aperture of a size substantially the same as or not greater than that of the image of the light spot;

wherein the pattern on the surface of the object is detected on the basis of light passed through said stop member.

In one preferred form of the present invention, the above-described scanning means comprises an arrangement by which the surface of the object can be displaced relative to the light beam and in a plane perpendicular to the optical axis of the light receiving optical arrangement In another preferred form, the scanning means may comprise a deflecting arrangement including a polygonal mirror, a galvano-mirror, an acousto-optic element or otherwise, for deflecting the light beam. In the latter case, wherein the detection optical system includes a scanning means for deflecting a light beam, the light from the surface of the object is directed by way of the scanning means to a stop member (restriction member).

With the described features of the present invention, only such light as coming from a point on the surface of the object, as being illuminated by the light beam, is detected irrespective that the surface of the object is covered by a transparent layer, such as a photoresist layer. Accordingly, a high-accuracy pattern detection is attainable.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 5:
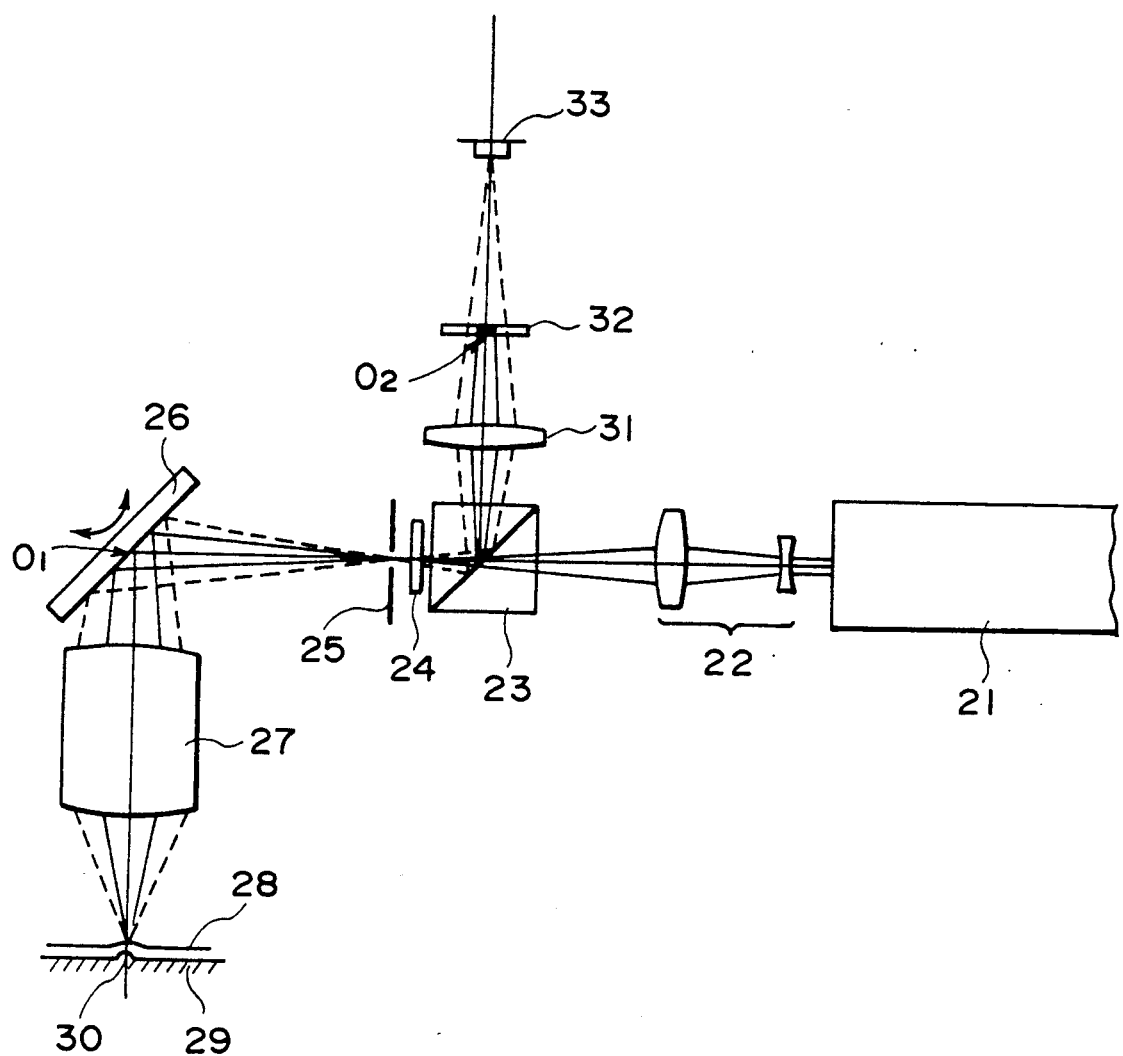
FIG. 5 is a schematic view showing a general optical arrangement of a detection optical system according to one embodiment of the present invention.

Referring now to FIG. 5, there is shown a detection optical system according to one embodiment of the present invention.

A laser beam emitted from a laser source 21 is transformed by a beam shaping optical system 22 into a light beam having a predetermined cross-sectional shape and a predetermined cross-sectional beam diameter. The thus shaped light beam passes through a polarization beam splitter 23. In the present embodiment, the laser source 21 is arranged to produce a laser beam of P-polarized light whose direction of polarization is contained in the plane of the sheet of the drawing. Subsequently, the laser beam passes through a quarter waveplate 24 so that it is transformed into a circularly polarized light. Then, the laser beam irradiates an aperture stop 25 (restriction member). The aperture stop 25 is provided to determine the shape and size of a light spot to be formed by a light beam on the surface of an object such as a wafer 29 in this embodiment. The aperture stop 25 is placed in an imaging relation with the surface of the object. Therefore, the shape of the aperture of this aperture stop 25 can determine the shape of the light spot to be formed on the object surface by the light beam. After passing through the aperture of the aperture stop 25, the light is deflected by an oscillation mirror 26 which is controlled by a driving means (not shown). The deflected light is focused by an f-$\theta$ lens 27 upon the surface of the wafer 29 which is a surface to be scanned. In the present embodiment, the mirror 26 and the f-$\theta$ lens 27 are disposed so that the point $O_1$ of reflection on the oscillation mirror 26 coincides with the focus position of the f-$\theta$ lens 27 and also that the reflection point $O_1$ is at the position of the pupil of the f-$\theta$ lens 27. The focused light beam enters into a photoresist layer 28 provided on the wafer 29 surface and forms a light spot on the wafer 29 surface. Simultaneously therewith, it scans an alignment mark 30 provided on the wafer 29 surface.

Since the pupil and the focus position of the f-$\theta$ lens 27 are defined at the reflection point $O_1$ of the oscillation mirror 26 (which point is an origin of deflection of the oscillation mirror 26), the f-$\theta$ lens 27 can function as a telecentric lens with the result that the light beam is perpendicularly incident on the wafer 29 surface and scans the same at a constant speed. The light impinging on the wafer 29 surface is regularly or specularly reflected when it is incident on a flat portion of the wafer 29 surface, so that it goes back along its oncoming path. When the light is incident on a stepped portion such as a mark 30, it is scatteringly (diffractively) reflected. Such scattered light goes back to the aperture stop 25 by way of the f-θ lens 27 and the oscillation mirror 26 and irradiates the aperture stop 25 in a direction opposite to that in which the light beam has advanced for illumination of the wafer 29 surface. At this time, the light irradiating the aperture stop 25 in the opposite direction has a beam diameter which has been expanded by an amount resulting from the inclusion of multireflected light such as rays 14 and 15 shown in FIG. 2. Thus, the beam diameter of light irradiating the aperture stop 25 in this direction is larger than the size of the aperture of the aperture stop 25. Accordingly, by passing the light from the wafer 29 surface through this aperture stop 25 in the opposite direction, the component of light having been diverged due to multireflection can be substantially blocked or excluded.

After passing through the aperture of the aperture stop 25, the light scattered from and/or specularly reflected from the wafer 29 enters again the quarter waveplate 24 so that it is transformed into an S-polarized light. Subsequently, the light is reflected by the polarization beam splitter 23 toward an imaging lens 31. The light from the imaging lens 31 is incident on a spatial filter 32 which is placed at a position $O_2$ that is optically conjugate with the reflection point $O_1$ of the oscillation mirror 26. By this spatial filter 32, the specularly reflected light component is blocked, but the scattered light component is allowed to pass therethrough. Accordingly, the scattered light can be received as a "dark-field signal" by a photoelectric converter (photodetector) 33 whose light-receiving surface is disposed at a position which is optically conjugate with the aperture stop 25.

In a system for detecting light from the wafer 29 surface, in the optical arrangement of the FIG. 5 embodiment, an enlarged image of a light spot (formed on the wafer 29 surface by the light beam) is formed by the f-θ lens 27 at the position of the aperture stop 25. The size and shape of the aperture of the stop 25 can be made to be the same as those of the image of the light spot formed at the stop 25 position. Therefore, there is substantially no possibility that light from any location on the wafer 29 surface, other than the point being illuminated by the light beam, passes through the aperture of the stop 25. In other words, it is possible to avoid the adverse affect of any stray light, such as a multireflected light caused as a result of the presence of the photoresist layer 28, covering the wafer 29 surface. Therefore, the alignment mark 30 on the wafer 29 can be detected correctly.

In the present embodiment, a common stop member provides a field stop for determining the size and shape of a light beam, irradiating the wafer 29 surface, and also provides a restriction means for regulating the light reflected from the wafer 29 surface. However, as will be described later, the provision of a field stop is not always required. In the present invention, what is important is the provision of a stop or restriction member at the position whereat an image of a light spot on the surface of the object is formed, the stop member having an aperture of a size substantially the same as, or not greater than, that of the image of the light spot, such that any light from an unwanted portion of the object surface is blocked by the stop member.

In the present invention, the image of the light spot is preferably an enlarged image, in consideration of the advantageous effects with respect to the ease in the setting of the aperture stop, efficient utilization of light, etc.

Figure 6:
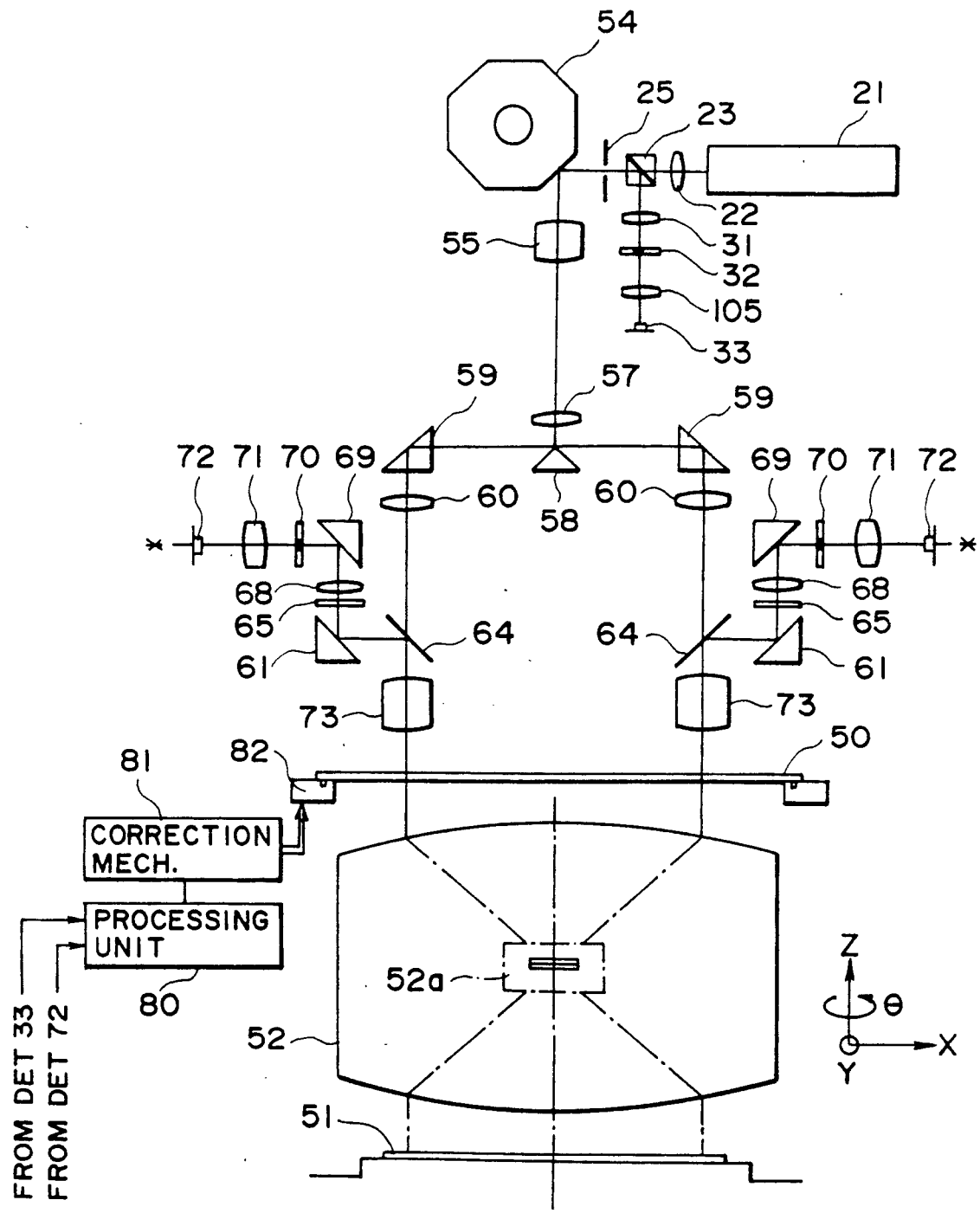
FIG. 6 is a schematic and diagrammatic view showing a general arrangement of a mask-to-wafer alignment system into which the detection optical system shown in FIG. 5 is incorporated.

Referring now to FIG. 6, there is shown another embodiment of the present invention, wherein the detection optical system described with reference to FIG. 5 is incorporated into a mask-to-wafer alignment system which, in turn, is incorporated into a projection exposure apparatus for projecting a circuit pattern of a mask upon a wafer by use of a projection lens system.

Reference numeral 50 in FIG. 6 denotes a mask; reference numeral 51, a wafer; reference numeral 52, a projection lens system operable to project, at a unit magnification or in a reduced scale, an image of a circuit pattern of the mask 50 upon the wafer 51; and reference numeral 52a, a quarter waveplate effective to separate light reflected by the mask and light reflected by the wafer, on the basis of the difference in the direction of polarization.

Figure 7:
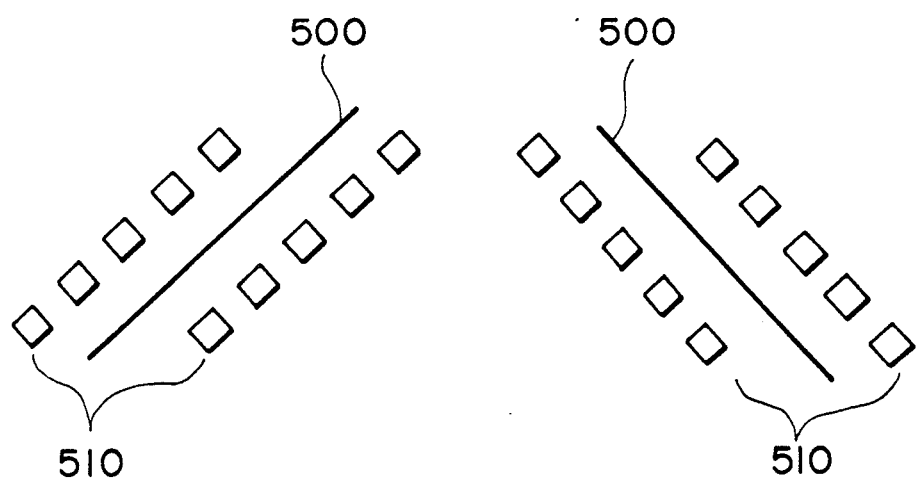
FIG. 7 is a schematic view exemplifying alignment marks formed on a mask and a wafer.

Two alignment marks, each being such as shown in FIG. 7, are provided on each of the mask 50 and the wafer 51. More specifically, the wafer 51 is provided with two, left-hand and right-hand alignment marks, each comprising, for example, inclined dot arrays 510 shown in FIG. 7. On the other hand, the mask 50 is provided with two left-hand and right-hand alignment marks, each comprising, for example, inclined bar-like elements 500 also shown in FIG. 7.

Laser light source 21 used in the present embodiment produces a P-polarized laser beam which is rectilinearly polarized in the plane of the sheet of the drawing. Polygonal mirror 54 is rotatable at a constant speed. F-θ lens 55 is contributable to assuring constant-speed scan of the mask 50 with the laser beam. Field dividing prism 58 is provided to divide the range of scan by the laser beam. This prism 58 is effective to divide one scan cycle of the laser beam determined by the polygonal mirror 54 into first and second halves, these halves being used for the two alignment marks of each of the mask 50 and the wafer 51. The structure following the field dividing prism 58 comprises left-hand and right-hand systems of symmetric structure, and the same reference numerals are assigned to corresponding elements.

Each of the left-hand and right-hand systems includes a half mirror 64 having a small reflection factor; a polarizing plate 65; a relay lens 68; a reflecting member 69; a spatial filter 70; a condensing lens 71; a photoreceptor 72 for receiving light coming from the mask 50; a microscope objective lens (hereinafter "objective lens") 73 which comprises a telecentric optical system similar to the f-θ lens 27 of the FIG. 5 embodiment and which is set at a position to view a corresponding one of the alignment marks of the mask 50 and a corresponding one of the alignment marks of the wafer 51. The objective lens 73 has a pupil which is placed in an optically conjugate relation with the light reflecting point on the polygonal mirror 54.

In operation, the laser beam emitted from the laser source 53 impinges upon the polygonal mirror 54 and is reflected thereby. With the rotation of the polygonal mirror 54, the laser beam is scanningly deflected and, subsequently, it is transformed into a parallel beam by the f-θ lens 55. Thereafter, it passes through the lens 57 and is projected on the prism 58 which comprises a roof prism. For example, the laser beam is reflected first by a left-hand inclined surface of the prism 58 so that it is directed leftwardly, as viewed in the drawing. In the course of the scanning deflection by the mirror 54, the laser beam is reflected by a right-hand inclined surface of the prism 58 so that it is directed rightwardly.

The laser beam reflected by the prism 58 is reflected again by the prism 59 and passes through the relay lens 60 and the half mirror 64. The laser beam from the half mirror 64 enters the objective lens 73 and it is focused on the mask 50. After passing through the mask 50, the light is focused again on the wafer 51 by the projection lens system 52 which is, in the present embodiment, of a what is called "dual telecentric type" wherein it is telecentric both on the mask 50 side and on the wafer 51 side. Therefore, both the mask 50 and the wafer 51 are scanned by light spots, respectively.

First, the light reflected by the alignment mark 500 of the mask 50 goes through the objective lens 73 and is reflected by the half mirror 64. The light coming back from the mask 50 and reflected by the half mirror 64 is directed by the prism 61 to the polarizing plate 65 and is incident thereupon. By this polarizing plate 65, the linearly polarized light component reflected from the mask 50 and having such a direction of polarization as being contained in the plane of the sheet of the drawing, is allowed to pass therethrough. On the other hand, such a rectilinearly polarized light component (S-polarized light component) as having been reflected from the wafer 51 and having passed through the quarter waveplate 52a reciprocatingly (twice) so that the direction of polarization has been changed to be perpendicular to the sheet of the drawing, is blocked by the polarizing plate 65. Then, the light coming from the mask 50 and passing through the polarizing plate 65 goes through the relay lens 68 and is reflected by the reflector 69. Thereafter, by means of the filter 70, the specularly reflected component of the light from the mask 50 is blocked. On the other hand, the light component having been scatteringly reflected by the edge of the alignment mark 500 is converged by the condensing lens 71 and projected upon the photoreceptor (detector) 72.

In this manner, autofocusing signals representing the positions of the alignment marks 500 of the mask are obtained at the detectors 72.

Second, the wafer scanning laser beam passing through the mask 50 from above enters into the projection lens system 52 and thus passes through the quarter waveplate 52a which is disposed at the pupil of the projection lens system 52. By this quarter waveplate 52a, the laser beam is transformed into a circularly polarized light which, in turn, scans the wafer 51 surface. The light scatteringly reflected by the edge of the alignment mark 510 on the wafer 51 passes the quarter waveplate 52a again, in an opposite direction, whereby it is transformed into a linearly polarized light (S-polarized light) whose direction of polarization is rotated by 90 degrees as compared with that of the laser beam irradiating the wafer 51 surface. The light emanating from the projection lens system 52 goes upwardly through the objective lens 73, the half mirror 64 and the prism 59, and it is reflected by the roof prism 58 back to the polygonal mirror 54 so that it is reflected by the polygonal mirror. Subsequently, as has been described with reference to the first embodiment, the light passes through the aperture stop 25 and impinges on the polarization beam splitter 103. Since the light from the wafer 51 has been transformed into a rectilinearly polarized light, perpendicular to the sheet of the drawing, by the function of the quarter waveplate 52a, it is reflected by the polarization beam splitter 23 and, after passing through the condensing lens 31 and the light transmitting portion of the spatial filter 32, it is projected upon the detector 33. It will be appreciated that the light component having been specularly reflected by the wafer 51 surface is blocked by a light blocking portion of the spatial filter 32.

In this manner, autofocusing signals representing the positions of the alignment marks 510 on the wafer 51 are obtained at the detector 33.

Then, on the basis of these autofocusing signals and the autofocusing signals concerning the alignment marks on the mask 50 as obtained from the photoreceptors 72, a processing unit 80 executes calculations to determine positional errors with respect to the X, Y and $\theta$ directions. In accordance with the results of calculation, a correction mechanism 81 is actuated to displace the mask stage 82 to complete the alignment of the mask 50 and the wafer 51 with each other. Instead of displacing the mask 50, the wafer stage may be moved to displace the wafer to accomplish the alignment.

Figure 8:
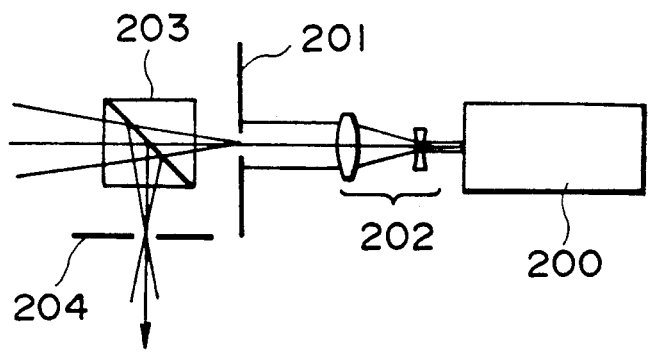
FIGS. 8 and 9 are fragmentary schematic views, respectively, showing modified forms of the detection optical system of the FIG. 5 embodiment.

An important feature of the present embodiment lies in the provision of a dual-filtering system which comprises a first restriction means disposed at a position corresponding to the surface of the object and a second restriction means disposed at a position corresponding to the pupil plane. However, the manner of providing such restriction means may be modified in various ways. An example is shown in FIG. 8. In this example, a light beam emitted from a laser source 200 is expanded by a beam expander 202 and passes through an aperture stop 201 which is placed in an optically conjugate relation with the surface of a wafer 51 (FIG. 6). Thereafter, the light beam from the aperture stop 201 goes through a polarization beam splitter 203. As described hereinbefore, the light scanning the wafer 51 and reflected thereby has its direction of polarization rotated by 90 degrees, so that it is reflected by the polarization beam splitter 203. The light from the beam splitter 203 passes through an aperture stop 204 which is disposed in an optically conjugate relation with the wafer 51 surface. Namely, as described, two restriction means 201 and 204 may be disposed separately and at such positions which are in an optical imaging relation with the intervention of the wafer 51 surface. Use of the polarization beam splitter 203 is preferable, because it assures efficient utilization of the light quantity. If the quantity of light is sufficient, any other optical element such as a half mirror, for example, may be used without inconveniences, as will be described later.

Figure 9:
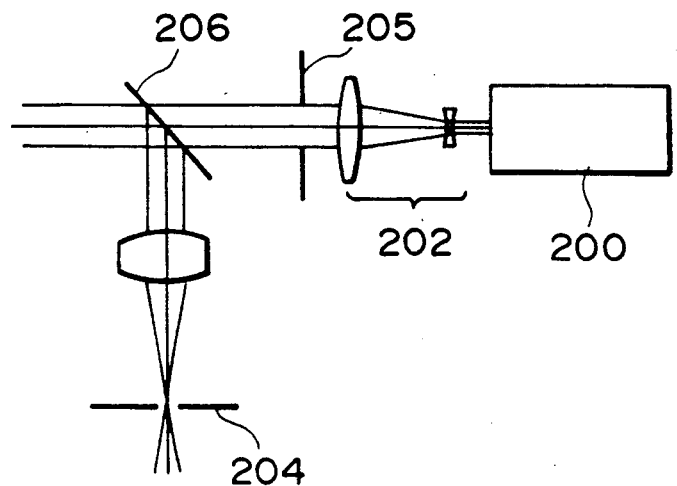

In the example of FIG. 8, the aperture stop 201 which receives a laser beam and functions as a field stop, is disposed in an imaging relation with the wafer 51 surface. The FIG. 8 example may be modified in such manner as illustrated in FIG. 9, wherein an aperture stop 205 is provided at a pupil plane (a plane which is conjugate with the pupil of the objective lens). In this case, use of another stop member 204 at the light receiving side is necessary, as a matter of course. It should be noted here that the stop member 204 is not in an imaging relation with the stop 205. Denoted at 206 in FIG. 9 is a beam splitter.

Figure 10:
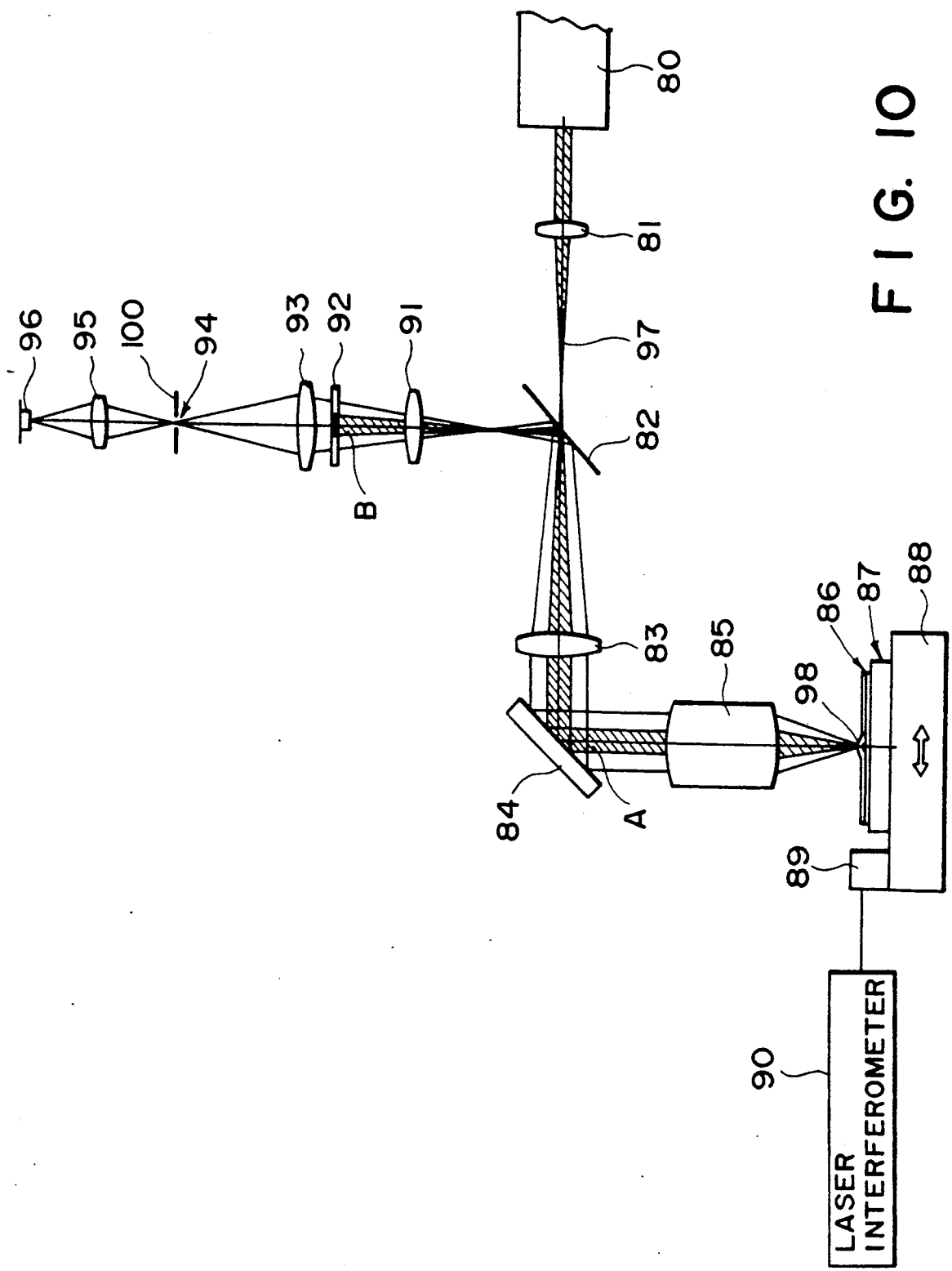
FIG. 10 is a schematic and diagrammatic view showing a general arrangement of a pattern detecting apparatus according to another aspect of the present invention.

Referring now to FIG. 10, there is shown a detecting device according to another embodiment of the present invention. As compared with the foregoing embodiments, wherein a light beam is deflected by a polygonal mirror or a deflecting mirror (galvano mirror) to scan the surface of an object, in the present embodiment the light beam is held stationary while, on the other hand, the object having a surface to be scanned or examined is moved.

In the arrangement shown in FIG. 10, denoted at 80 is a laser source. A laser beam from the laser source 80 is converged by a beam shaping optical system 81 at a position denoted at 97 in FIG. 10. When the focusing of the light beam at the convergence point 97 is made by use of such a system close to the diffraction limit and having substantially no aberration, a light beam of desired shape is easily obtainable at the position 97. The beam shaping optical system 81 may comprise an ordinary lens system or a cylindrical lens system. In the latter case (cylindrical lens), a slit-like beam spot is formed at the position 97. Additionally, a similar beam spot is formed on the surface of a wafer 86.

The light beam divergently advancing from the convergence point 97 passes through a beam splitter 82 and a relay lens 83 and, after being reflected by a reflecting mirror 84, it enters into an objective lens 85. By this, a light spot having the same shape as the light beam spot formed at the convergence position 97, is formed at a position 98 on the wafer 86 surface, which is optically conjugate with the convergence position 97. In FIG. 10, the area depicted with hatching denotes the flux of a light beam impinging perpendicularly upon the wafer 86 surface. It is seen that the diameter of such a wafer irradiating beam is smaller than the effective diameter of the objective lens.

Figure 1:
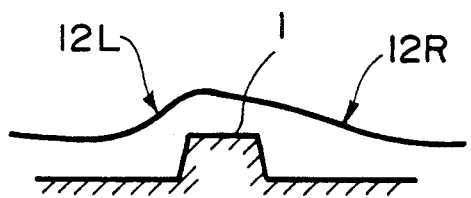
FIG. 1 is a schematic view explaining the presence of a photoresist layer covering an alignment mark on a wafer.
Figure 2:
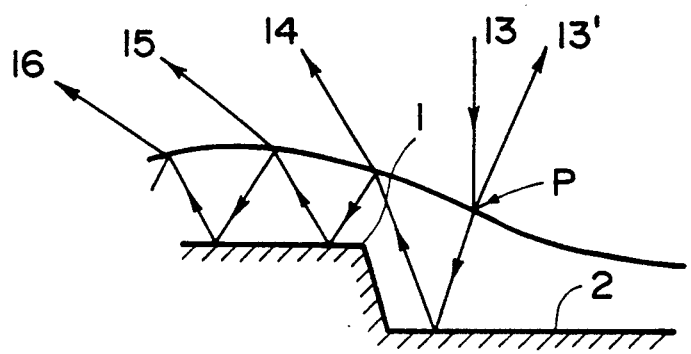
FIG. 2 is a schematic view explaining the multireflection of light, resulting from the presence of a photoresist layer.
Figure 3:
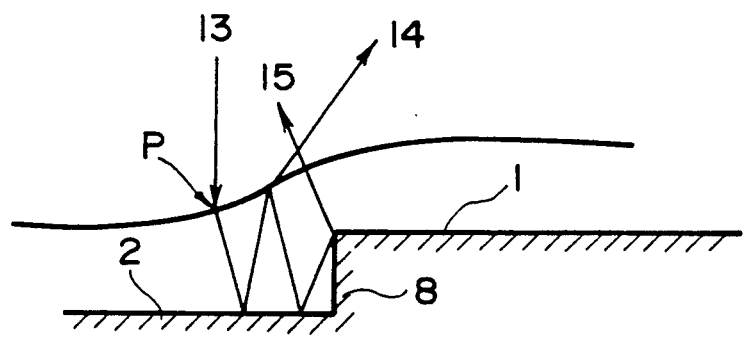
FIG. 3 is a schematic view explaining the scattering of light, resulting from the presence of a photoresist layer.
Figure 4:
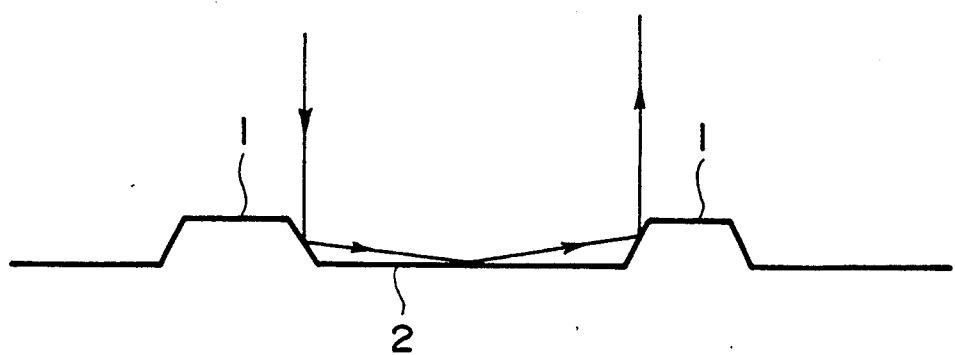
FIG. 4 is a schematic view explaining undesirable reflection of light between alignment marks on a wafer.

As described with reference to FIG. 2, the wafer 86 is coated with a photoresist material. The presence of such a photoresist layer leads to the possibility of multireflection of light which, in turn, causes deterioration of the measurement accuracy, as described hereinbefore. In the example of FIG. 10, there is a possibility that a light beam which should be reflected at the position 98 on the wafer is shifted laterally due to the multireflection, such that it is scatteringly reflected at a position spaced from the position 98. Such lateral shift may occur inversely.

In the present embodiment, the wafer 86 is placed on a table 87 which is movable with the movement of a stage 88 to thereby change the positional relationship of the wafer 86 with the incident light beam. Namely, the wafer 86 can be scanned with the incident light beam. Denoted at 89 is a fixed mirror mounted on the stage 88. The mirror 89 is cooperable with a well-known type laser interferometer 90 to monitor the coordinate position of the wafer 86. The light reflected by the wafer 86 contains a regularly or specularly reflected light component, a scattered light component and a multireflected light component. The light reflected by the wafer 86 and passing through the objective lens 85 goes back to the half mirror 82 by way of the mirror 84 and the relay lens 83. The light reflected by the half mirror 82 passes through a field lens 91. The relay lens 83 and the field lens 91 are cooperable to form, at a position B, an image of the pupil of the objective lens 85 which is at a front focal point position A. At the position B, there is provided a spatial filter 92 which functions to intercept the light flux depicted by hatching, namely, the specularly reflected light which is the component of the incident light reflected by a flat surface portion of the wafer. The light passing through the spatial filter 92 contains, therefore, scattered light (diffraction light) and multireflected light. The light from the filter 92 is imaged again by an imaging lens 93 at a position 94 which is optically conjugate with the wafer 86 surface. Also, the position 94 is optically conjugate with the position 97 with the intervention of the wafer 86 surface. Accordingly, by providing, at the position 94, a field stop such as at 100 having an aperture of a size substantially the same as, or not greater than, the size of the image of the light spot formed on the wafer 86 surface (the image being formed at the position 94, as described with reference to the foregoing embodiments), it is possible to intercept the multireflected light component by means of the stop 100 at the position 94, because such multireflected light component is being shifted laterally from the aperture of the field stop. Actually, the image viewed at the position 94 is larger than the size of the original light beam having formed a light spot on the wafer 86 surface, due to the multireflection within the photoresist layer. Thus, the light passing through the stop 100 is one having been scatteringly reflected by the edge of an alignment mark on the wafer 86. The light from the stop 100 is directed by a lens 95 to a photodetector 96.

It will be readily understood from the foregoing description that, in the optical arrangement of the FIG. 10 example, the photodetector 96 produces an output signal only when the light beam from the laser source 80 impinges against the edge of the alignment mark on the wafer 86 as the wafer 86 is displaced by the stage 88. Also, it will be understood that in the present embodiment, as in the cases of the foregoing embodiments, an enlarged image of the light spot is formed at the position 94 by the cooperation of the lenses 85, 83, 91 and 93. In the optical arrangement shown in FIG. 5, there is a possibility that, when the reflected light from the wafer 29 passes through the aperture stop 25, it is diffracted by the stop 25 and, due to the thus produced diffraction light, the accuracy of measurement is degraded. For this reason, in the FIG. 5 embodiment, it is necessary to pay specific attention to the spatial filter or the alignment mark to be used. As compared therewith, there is no such limitation in the case of the FIG. 10 embodiment because, in the optical arrangement of the FIG. 10 embodiment, the stop 100 is disposed after the spatial filter 92.

The above-described adverse affect of the diffraction light, which might be caused by the aperture stop 25, in the optical arrangement of FIG. 5, can be avoided, for example, in the following manner:

As an alignment mark, a dot-like pattern such as illustrated at 510 in FIG. 7 may be used, for example. On the other hand, a slit-like light spot whose lengthwise direction extends along the dot array of that pattern, may be formed on the wafer. Further, an aperture stop member having a slit-like aperture as well as a spatial filter which has a light blocking portion effective to block "zero-th" order diffraction light and a light transmitting portion extending in the lengthwise direction of the slit-like aperture of the stop and being effective to transmit diffraction light of "±m-th" order (where m>1), being diffracted in the direction of the dot array of the pattern, may be prepared and incorporated into the optical arrangement of FIG. 5.

Although the stop member and the spatial filter used in the foregoing embodiments have a light transmitting portion for allowing passage of light and a light blocking portion for blocking the light, they may be formed by a combination of a light reflecting portion for reflecting light and a light transmitting or blocking portion.

Further, the embodiments described in the foregoing are arranged to conduct what is called "dark-field detection" wherein only the scattered light from the edge of a pattern is detected. However, the present invention is not limited to this, but is also applicable to what is called "dark-field detection" wherein a regularly or specularly reflected light, rather than the scattered light from the pattern edge, is detected with a modification of filtering at the pupil.

While the invention has been described with reference to the structures disclosed herein, it is not confined to the details set forth and this application is intended to cover such modifications or changes as may come within the purposes of the improvements or the scope of the following claims.

What is claimed is:

1. A detection optical system for detecting a pattern on a surface of an object, said detection optical system comprising:
    illumination means for illuminating the surface of the object with a light beam;
    scanning means cooperating with said illumination means for scanningly illuminating the surface of the object with the light beam;
    an optical arrangement comprising light receiving means for receiving light from each point on the surface of the object as scanningly illuminated with the light beam by the cooperation of said illumination means and said scanning means, said optical arrangement forming an image of a light spot, formed by the light beam upon the surface of the object; said optical arrangement further comprising a stop member disposed at a position where the image of the light spot is formed, said stop member comprising an aperture of a size not greater than that of the image of the light spot; and
    detecting means for detecting the pattern on the surface of the object on the basis of light passing through said stop member.

2. A detection optical system according to claim 1, wherein said optical arrangement further comprises an objective lens having a pupil and a filter member provided at a position optically conjugate with the pupil, for extracting only scattered light from the surface of the object, and wherein the pattern on the surface of the object is detected on the basis of light passing through said stop member and said filter member.

3. A detection optical system according to claim 2, wherein said filter member is disposed on an optical path between the surface of the object and said stop member, and wherein said stop member receives scattered light passing through said filter member.

4. A detection optical system according to claim 1, wherein said illumination means and said optical arrangement have a common optical path and wherein said stop member is disposed on the common optical path.

5. A detection optical system according to claim 1, wherein said scanning means comprises a rotatable reflection mirror for reflecting the light beam, said rotatable reflection mirror receiving light reflected from each point on the surface of the object, said reflecting mirror directing the light beam to said optical arrangement to form the image of the light spot.

6. A detection optical system according to claim 1, wherein the image of the light spot is an enlarged image of the light spot.

7. A pattern detecting device for detecting a pattern on a surface of an object, said pattern detecting device comprising:
    a light source;
    deflecting means for scanningly deflecting a light beam from said light source so as to scan the surface of the object with the light beam;
    an objective optical system for directing the light beam deflected by said deflecting means to the surface of the object;
    stop means for receiving light reflected by the surface of the object having been directed by said objective optical system and said deflecting means, said stop means comprising an aperture at a position optically conjugate with a light spot formed by the light beam upon the surface of the object;
    photoelectric converting means for receiving and detecting light passing through said aperture of said stop means and for photoelectrically converting the received light into an output signal;
    wherein the pattern on the surface of the object is detected on the basis of the output signal from said photoelectric converting means.

8. A detecting device according to claim 7, wherein said objective optical system comprises a telecentric objective lens having a pupil at which an origin of deflection for the light beam is defined.

9. A detecting device according to claim 8, further comprising filtering means provided at a position optically conjugate with the pupil of said objective lens, said filtering means blocking light specularly reflected by the surface of the object and directing light scattered by the surface of the object to said photoelectric converting means.

10. A detecting device according to claim 9, wherein said filtering means is provided on an optical path between said objective lens and said stop means.

11. A detecting device according to claim 7, wherein said aperture has a size not greater than that of the image of the light spot.

12. A detecting device according to claim 11, wherein the image of the light spot is an enlarged image of the light spot.

13. A detecting device according to claim 11, wherein the image of the light spot is an enlarged image of the light spot.

14. A pattern detecting device for detecting a pattern on a surface of an object, said pattern detecting device comprising:
    a movable stage for supporting the object;
    illumination means comprising a light source and an objective optical system, for illuminating the surface of the object with a light beam from said light source;
    driving means for moving said movable stage so that the surface of the object is scanned with the light beam;
    stop means for receiving light reflected by the surface of the object having been directed by said objective optical system, said stop means comprising an aperture having a size not greater than the size of an image of a light spot formed on said stop means and being at a position optically conjugate with a light spot formed by the light beam upon the surface of the object; and
    photoelectric converting means for receiving and detecting light passing through said aperture of said stop means and for photoelectrically converting the receiving light, such that the pattern on the surface of the object is detected on the basis of an output signal from said photoelectric converting means.

15. A detecting device according to claim 14, wherein said objective optical system comprises an objective lens having a pupil, wherein said pattern detecting device further comprises filtering means provided at a position optically conjugate with the pupil of said objective lens, and wherein light specularly reflected by the surface of the object is blocked by said filtering means while light scattered by the surface of the object is directed to said photoelectric converting means.

16. A detecting device according to claim 15, wherein said filtering means is provided on an optical path between said objective lens and said stop means.

17. A detecting device according to claim 14, wherein said aperture has a size not greater than that of the image of the light spot.

18. A detecting device according to claim 17, wherein the image of the light spot is an enlarged image of the light spot.

19. A detecting optical system for detecting a pattern on a surface of an object, said detection optical system comprising:

scanning means for scanning the surface of the object with a light beam;

an optical arrangement comprising light receiving means for receiving light from the surface of the object, said optical arrangement further comprising a stop member comprising an aperture formed at a position optically conjugate with a light spot formed by the light beam upon the surface of the object, said aperture having a size not greater than that of an image of the light spot; and detecting means for detecting the pattern on the surface of the object on the basis of light passing through said stop member.

* * * * *

UNITED STATES PATENT AND TRADEMARK OFFICE
CERTIFICATE OF CORRECTION

PATENT NO. : 5,048,967
DATED       : September 17, 1991
INVENTOR(S) : AKIYOSHI SUZUKI, ET AL.

It is certified that error appears in the above-identified patent and that said Letters Patent is hereby corrected as shown below:

COLUMN 2

Line 15, "o" should read --or--

COLUMN 3

Line 39, "arrangement" should read --arrangement.--.

COLUMN 13

Line 1, "receiving light" should read --received light--.

COLUMN 14

Line 4, "detecting optical system" should read --detection optical system--.

Signed and Sealed this

Twenty-third Day of February, 1993

Attest:

STEPHEN G. KUNIN

Attesting Officer

Acting Commissioner of Patents and Trademarks